United States Patent
Tseng et al.

(10) Patent No.: US 11,397,203 B2
(45) Date of Patent: Jul. 26, 2022

(54) ESTIMATING METHOD FOR BRAKING RESISTOR

(71) Applicant: Delta Electronics, Inc., Taoyuan (TW)

(72) Inventors: Shao-Kai Tseng, Taoyuan (TW);
Sheng-Han Wu, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 302 days.

(21) Appl. No.: 16/851,732

(22) Filed: Apr. 17, 2020

(65) Prior Publication Data

US 2021/0088566 A1 Mar. 25, 2021

(30) Foreign Application Priority Data

Sep. 24, 2019 (CN) .......................... 201910906123.4

(51) Int. Cl.
*H02P 27/06* (2006.01)
*H02P 3/22* (2006.01)
*G01R 27/08* (2006.01)

(52) U.S. Cl.
CPC ................ *G01R 27/08* (2013.01); *H02P 3/22* (2013.01); *H02P 27/06* (2013.01)

(58) Field of Classification Search
CPC . G05B 2219/41119; G01R 27/08; H02P 3/22; H02P 27/06
USPC .......................................... 318/434; 324/705
See application file for complete search history.

(56) References Cited

U.S. PATENT DOCUMENTS

| 5,513,058 A | 4/1996 | Hollenbeck |
| 7,996,167 B2 | 8/2011 | Kang et al. |
| 2012/0119685 A1* | 5/2012 | Ibori ...................... H02M 1/32 318/380 |

FOREIGN PATENT DOCUMENTS

| CN | 106006250 A | * | 10/2016 | |
| CN | 103792430 B | | 2/2017 | |
| CN | 106443241 A | | 2/2017 | |
| CN | 107797056 A | | 3/2018 | |
| CN | 208937644 U | | 6/2019 | |
| JP | 6015690 B2 | * | 10/2016 | |
| TW | 201513553 A | | 4/2015 | |
| TW | 201615988 A | | 5/2016 | |
| TW | 201621337 A | | 6/2016 | |
| WO | 2013/186065 A1 | | 12/2013 | |
| WO | WO-2013186065 A1 | * | 12/2013 | .............. H02P 27/06 |
| WO | 2016/101074 A1 | | 6/2016 | |
| WO | 2017/194196 A1 | | 11/2017 | |
| WO | WO-2017194196 A1 | * | 11/2017 | ................ B60L 7/02 |
| WO | 2019/138554 A1 | | 7/2019 | |

* cited by examiner

*Primary Examiner* — Jorge L Carrasquillo
(74) *Attorney, Agent, or Firm* — Kirton McConkie; Evan R. Witt

(57) ABSTRACT

An estimating method includes the following steps. Firstly, if the electrical machine control system is in the generator mode, a bus voltage of the bus capacitor is monitored continuously. Then, if the switch is turned to an on state, a first current value of a current flowing through the bus capacitor during an off state of the switch is calculated. Then, the switch is turned to the on state. Then, if the switch is turned to the off state, a second current value of a current flowing through the bus capacitor during the on state of the switch is calculated, and a resistance value of the braking resistor is estimated according to the first current value and the second current value.

10 Claims, 7 Drawing Sheets

ESTIMATING METHOD FOR BRAKING RESISTOR

FIELD OF THE INVENTION

The present disclosure relates to an estimating method, and more particularly to an estimating method of estimating a resistance value of a braking resistor, which is applicable to an electrical machine control system.

BACKGROUND OF THE INVENTION

Generally, an electrical machine control system is used for controlling an electrical machine and providing electric power to the electrical machine. When the electrical machine is operated in a generator mode, the mechanical energy is converted into electric energy and the electric energy is recharged to the DC link voltage of the electrical machine control system. If a power conversion circuit or a rectifying circuit of the electrical machine control system is only able to perform a unidirectional power conversion, the electric energy that is recharged to the electrical machine control system cannot be merged into the utility power system. For protecting the electrical machine control system, it is usually equipped with a braking resistor. By the braking resistor, the electric energy that is recharged to the electrical machine control system is therefore consumed in the form of heat. Since the DC link voltage is prevented from rising gradually, the purpose of protecting the electrical machine control system can be achieved.

Moreover, a discharging loop of the electrical machine control system further comprises a power switch. If the resistance value of the braking resistor is improper, the braking current is too large. Consequently, the lifespan of the power switch is reduced, or even the power switch will be burnt out. In a more serious situation, the electrical machine control system cannot be operated normally.

SUMMARY OF THE INVENTION

An object of the present disclosure provides an estimating method for a braking resistor. During the operations of an electrical machine control system, the resistance value of the braking resistor is estimated according to the operating parameters of the electrical machine control system. Consequently, the user can determine whether the resistance value of the braking resistor is proper. Since the possibility of erroneously using the braking resistor is reduced, the problem of burning out the power switch is avoided.

In accordance with an aspect of the present disclosure, an estimating method for an electrical machine control system is provided. The electrical machine control system is configured to control operations of an electrical machine and brake the electrical machine when entering a generator mode. The electrical machine control system includes a bus capacitor, a braking resistor and a switch. The braking resistor is electrically connected between the bus capacitor and the switch. The estimating method includes the following steps. Firstly, a step (S1) is performed to determine whether the electrical machine control system is in the generator mode. In a step (S2), if a determination of the step (S1) is satisfied, a bus voltage across both terminals of the bus capacitor is monitored continuously. Then, a step (S3) is performed to determine whether the switch is turned to an on state. In a step (S4), if a determination of the step (S3) is satisfied, a first current value of a current flowing through the bus capacitor during an off state of the switch is calculated according to a voltage variation of the bus capacitor from the off state of the switch to the on state of the switch, a time duration of the switch in the off state and a known capacitance value of the bus capacitor. In a step (S5), the switch is turned to the on state. Then, a step (S6) is performed to determine whether the switch is turned to the off state. In a step (S7), if a determination of the step (S6) is satisfied, a second current value of a current flowing through the bus capacitor during the on state of the switch is calculated according to a voltage variation of the bus capacitor from the on state of the switch to the off state of the switch, a time duration of the switch in the on state and the known capacitance value of the bus capacitor, and a resistance value of the braking resistor is estimated according to the first current value and the second current value.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1A:
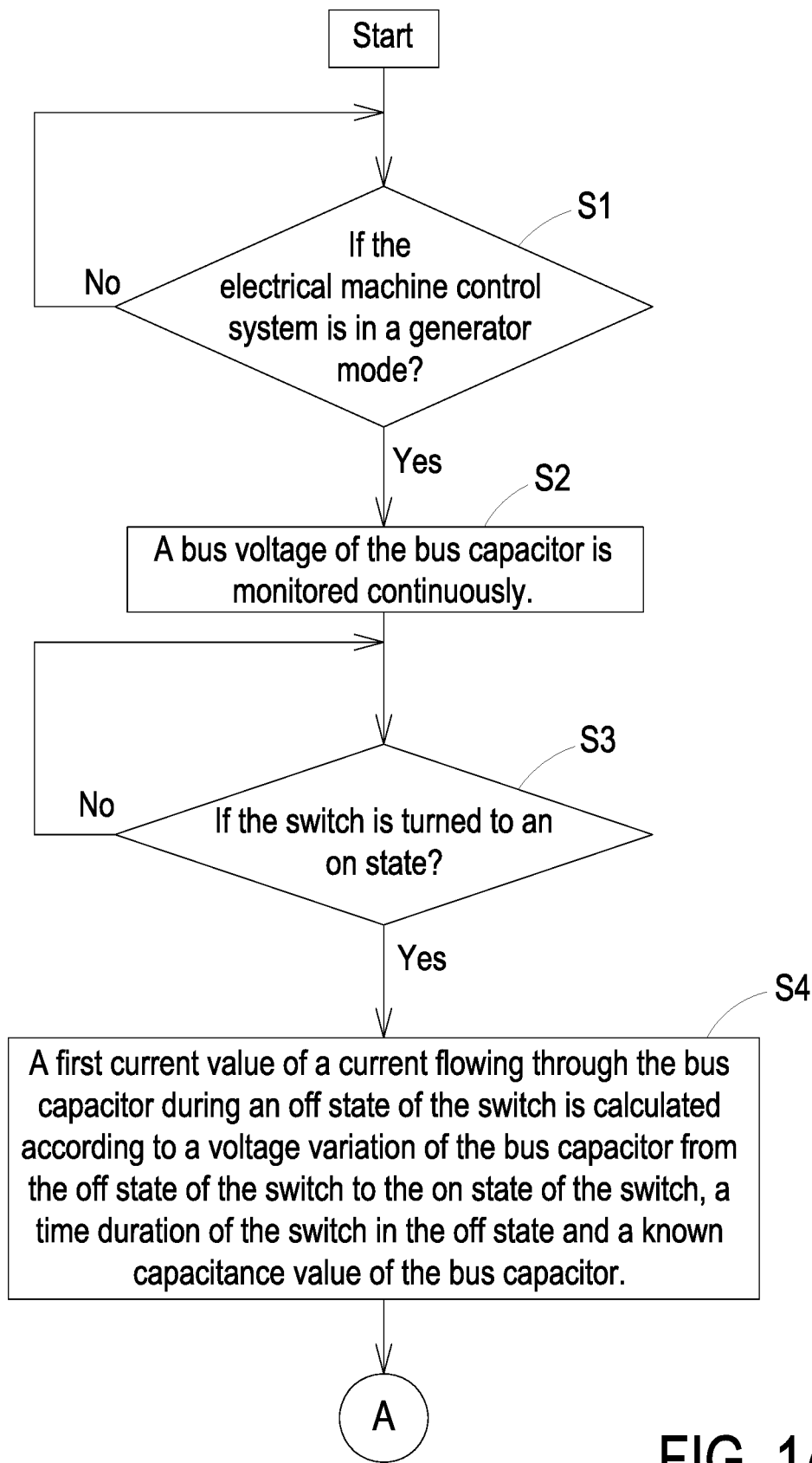
FIGS. 1A and 1B illustrate a flowchart of an estimating method for a braking resistor according to an embodiment of the present disclosure.
Figure 1B:
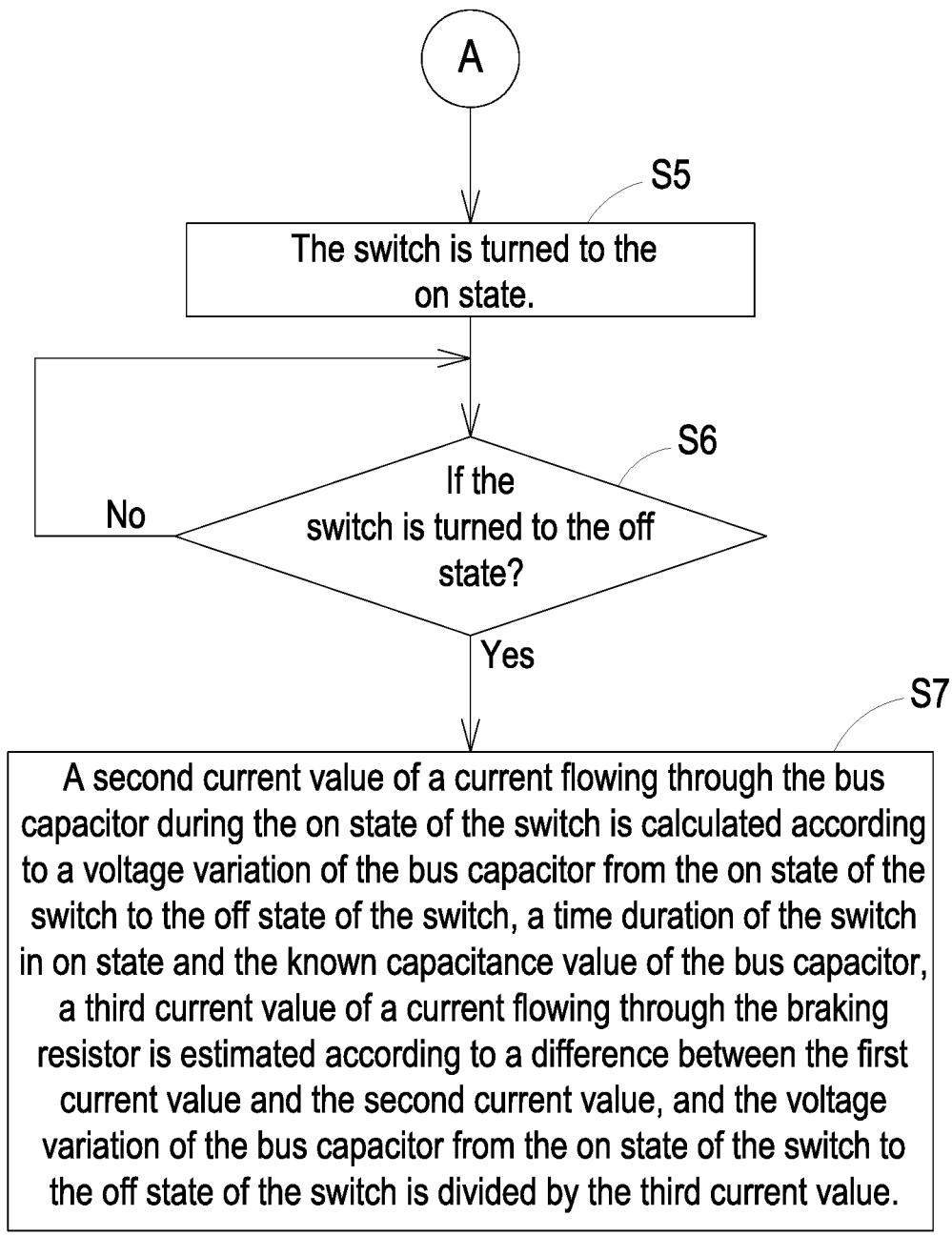
Figure 2:
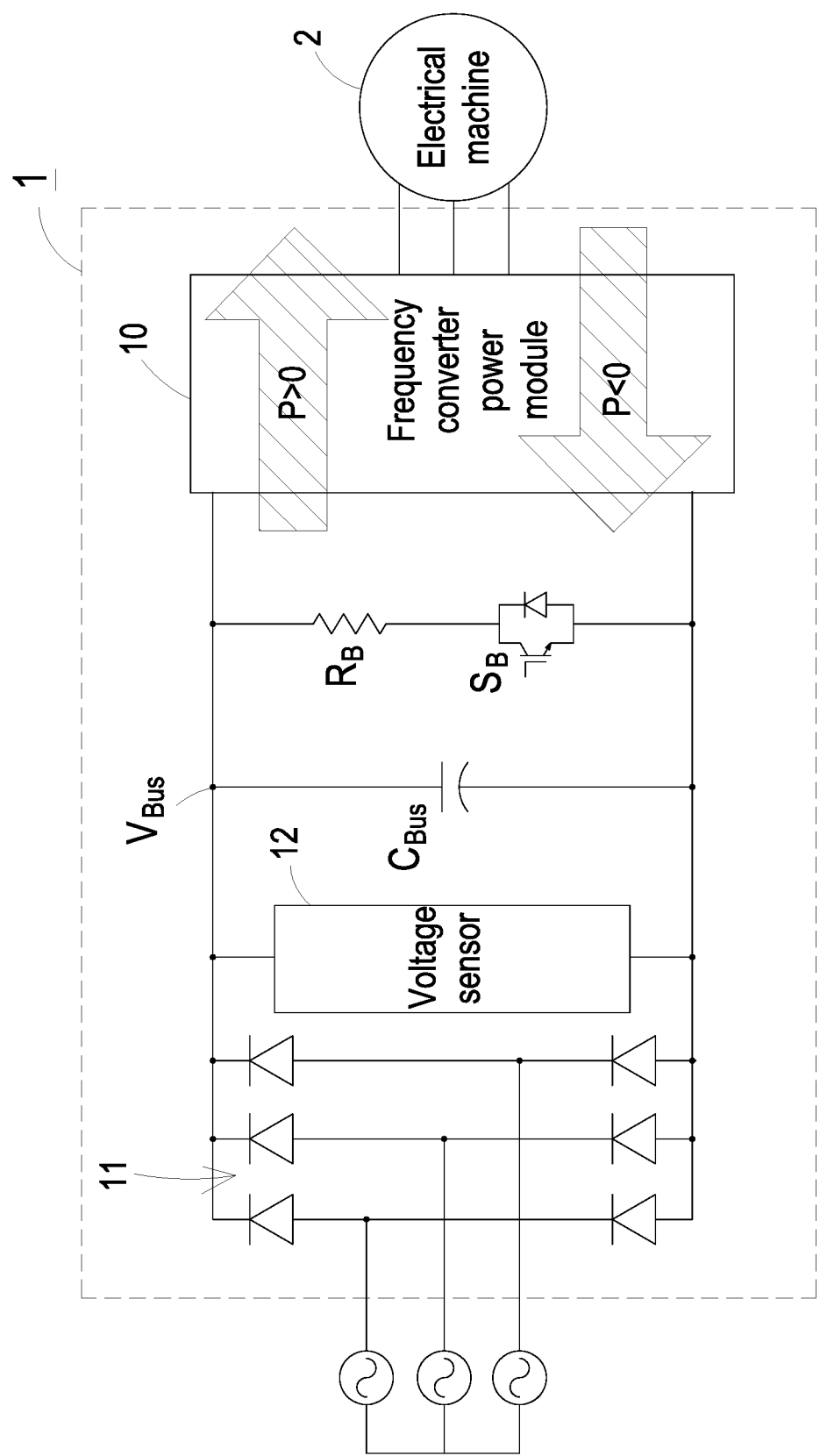
FIG. 2 is a schematic circuit diagram illustrates an electrical machine control system using the estimating method of the present disclosure.

Please refer to FIGS. 1A, 1B and 2. FIGS. 1A and 1B illustrate a flowchart of an estimating method for a braking resistor according to an embodiment of the present disclosure. FIG. 2 is a schematic circuit diagram illustrates an electrical machine control system using the estimating method of the present disclosure. The estimating method can be applied to an electrical machine control system 1. Preferably but not exclusively, the electrical machine control system 1 is an electrical machine control system of an elevator. Moreover, the electrical machine control system 1 is electrically connected with an electrical machine 2 (e.g., a motor) in order to provide electric power to the electrical machine 2 and control the operations of the electrical machine 2. In an embodiment, a power conversion circuit or a rectifier circuit of the electrical machine control system 1 is able to perform a unidirectional power conversion. Moreover, the electrical machine control system 1 can be operated in a motor (drive) mode or a generator (brake) mode.

In the motor mode, the received input AC energy is converted by the electrical machine control system 1, and the converted electric energy is provided to the electrical machine 2 to drive the operations of the electrical machine 2. In the generator mode, the electrical machine control system 1 brakes the electrical machine 2. Under this circumstance, the mechanical energy is converted into electric energy by the electrical machine 2, and the converted electric energy is recharged to the electrical machine control system 1 or an energy storage device (not shown).

Figure 3:
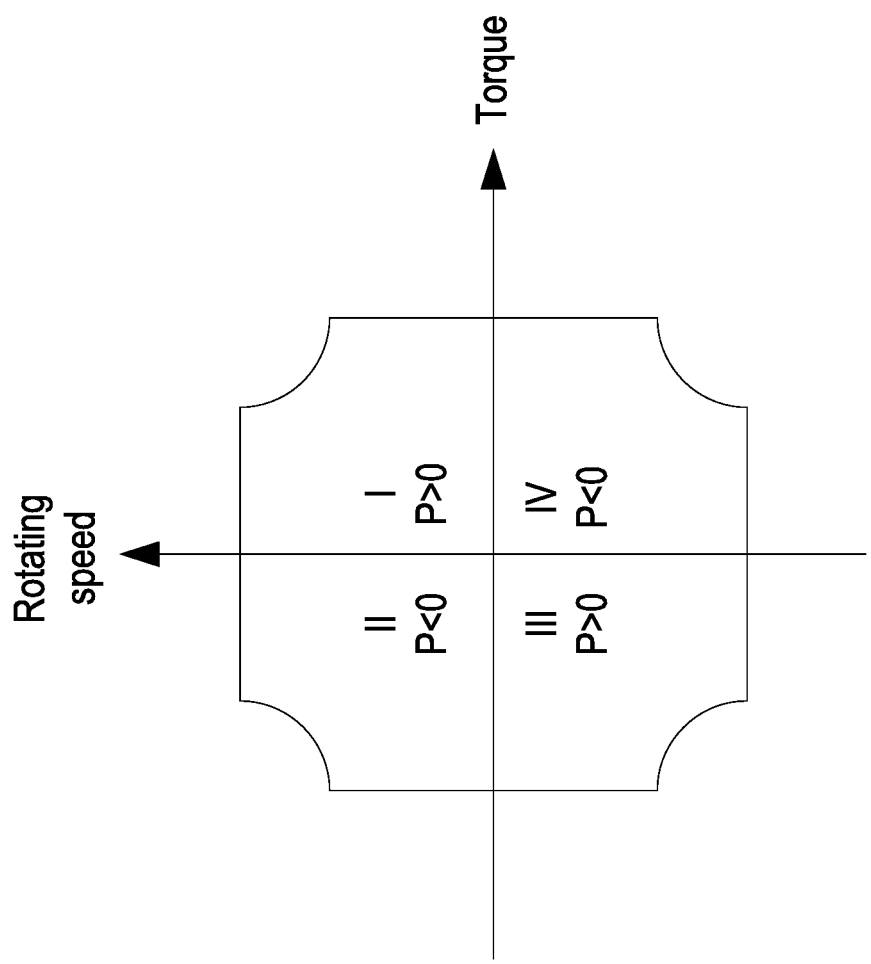
FIG. 3 is a working quadrant diagram illustrating the operations of the electrical machine control system as shown in FIG. 2.

FIG. 3 is a working quadrant diagram illustrating the operations of the electrical machine control system 1 as shown in FIG. 2. The operations of the electrical machine control system 1 may be divided into four conditions. For example, the electrical machine control system 1 is used to the control of the motor of an elevator. The elevator may be moved upstairs or downstairs. The motor may be rotated in two opposite directions accordingly (i.e., a forward rotation and a reverse rotation). The output torque of the elevator also has positive and negative values corresponding to the requirements of the elevator's acceleration and deceleration motions. According to the forward rotation or the reverse rotation of the motor and the positive value or the negative value of the output torque, the operating conditions of the electrical machine control system 1 may be expressed by four working quadrants.

In the first quadrant, the electrical machine control system 1 drives the forward rotation of the electrical machine 2. Meanwhile, the rotating speed of the electrical machine 2 is positive (>0), the torque of the electrical machine 2 is positive (>0), and the output power P of the electrical machine 2 is positive (>0). By the way, the arrow directions as shown in FIG. 2 indicate the electric energy conversion directions of the electrical machine control system 1 corresponding to the positive value and the negative value of the output power P.

In the second quadrant, the electrical machine 2 is rotated forwardly, and the electrical machine control system 1 brakes the electrical machine 2. Meanwhile, the rotating speed of the electrical machine 2 is positive (>0), the torque of the electrical machine 2 is negative (<0), and the output power P of the electrical machine 2 is negative (<0).

In the third quadrant, the electrical machine control system 1 drives the reverse rotation of the electrical machine 2. Meanwhile, the rotating speed of the electrical machine 2 is negative (<0), the torque of the electrical machine 2 is negative (<0), and the output power P of the electrical machine 2 is positive (>0).

In the fourth quadrant, the electrical machine 2 is rotated reversely, and the electrical machine control system 1 brakes the electrical machine 2. Meanwhile, the rotating speed of the electrical machine 2 is negative (<0), the torque of the electrical machine 2 is positive (>0), and the output power P of the electrical machine 2 is negative (<0).

When the electrical machine control system 1 is in the motor mode, the operating condition of the electrical machine control system 1 is in the first quadrant or the third quadrant of FIG. 3. When the electrical machine control system 1 is in the generator mode, the operating condition of the electrical machine control system 1 is in the second quadrant or the fourth quadrant of FIG. 3. The estimating method is executed when the electrical machine control system 1 is in the generator mode. That is, the operating condition of the electrical machine control system 1 is in the second quadrant or the fourth quadrant of FIG. 3.

Please refer to FIG. 2 again. The electrical machine control system 1 comprises a frequency converter power module 10, a rectifier circuit 11, a bus capacitor $C_{Bus}$, a braking resistor $R_B$, a (power) switch $S_B$ and a voltage sensor 12. The rectifier circuit 11 is electrically connected with an input terminal of the electrical machine control system 1. After the input AC energy is received by the electrical machine control system 1, the input AC energy is converted into DC energy by the rectifier circuit 11. The bus capacitor $C_{Bus}$ is electrically connected with an output terminal of the rectifier circuit 11. By the bus capacitor $C_{Bus}$, the DC energy from the rectifier circuit 11 is stabilized. The voltage sensor 12 is electrically connected with both terminals of the bus capacitor $C_{Bus}$. A bus voltage $V_{Bus}$ of the bus capacitor $C_{Bus}$ is sensed by the voltage sensor 12. The braking resistor $R_B$ is electrically connected between the bus capacitor $C_{Bus}$ and the switch $S_B$. While the electric energy of the electrical machine 2 is recharged to the electrical machine control system 1 in the generator mode, the recharged electric energy is consumed by the braking resistor $R_B$. Especially, the braking resistor $R_B$ and the switch $S_B$ are electrically connected with each other in series. Moreover, the serially-connected structure of the braking resistor $R_B$ and the switch $S_B$ is further connected with the bus capacitor $C_{Bus}$ in parallel.

An input terminal of the frequency converter power module 10 is electrically connected with the bus capacitor $C_{Bus}$. An output terminal of the frequency converter power module 10 is electrically connected with the electrical machine 2. The stabilized DC energy from the bus capacitor $C_{Bus}$ is converted into an output AC energy by the frequency converter power module 10. The electrical machine 2 is powered by the output AC energy. When the electrical machine control system 1 is in the motor mode, the switch $S_B$ is in an open status (i.e., an off state). When the electrical machine control system 1 is in the generator mode, the switch $S_B$ is turned to the open status (i.e., the off state) or a close status (i.e., an on state).

Figure 4:
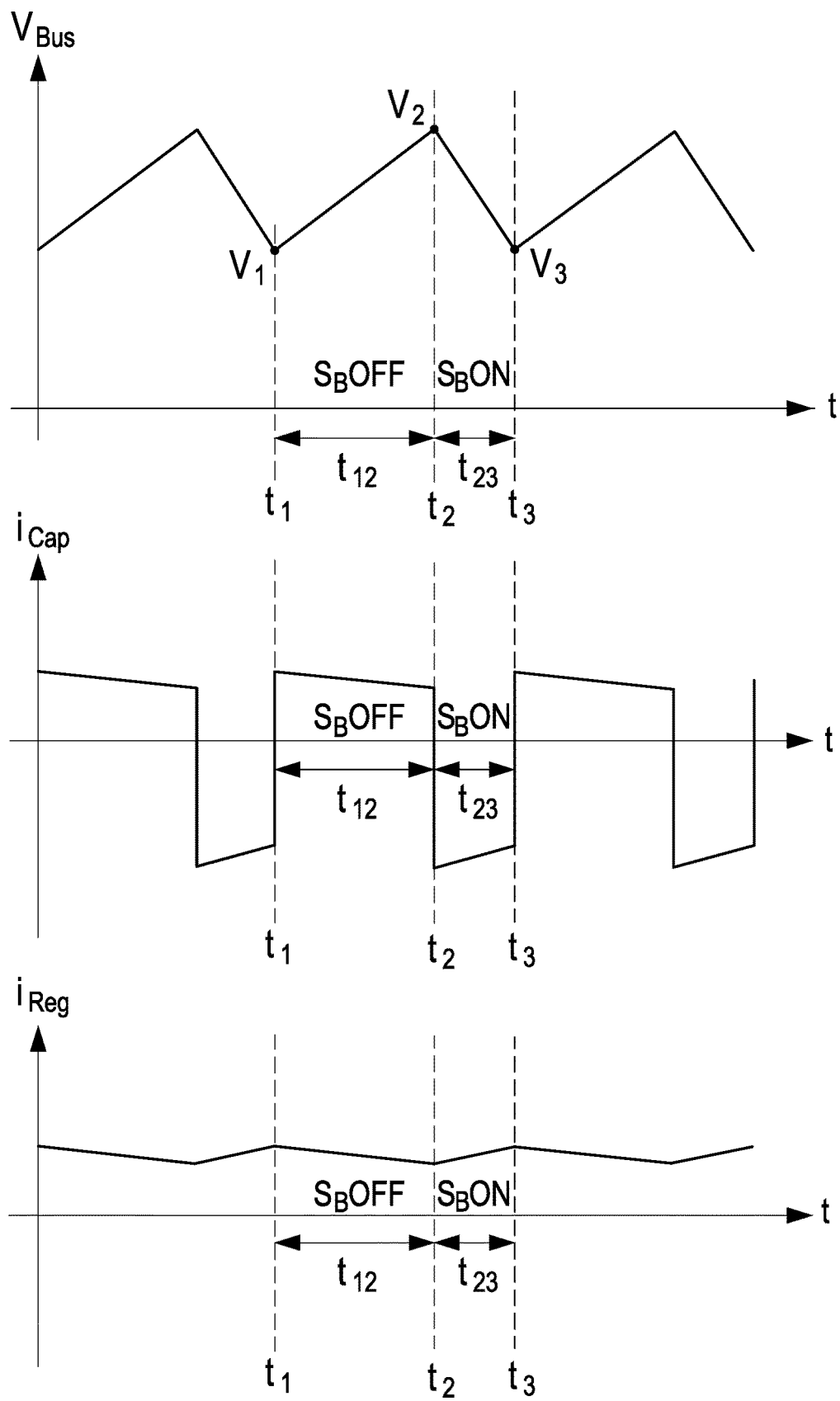
FIG. 4 is a schematic timing waveform diagram illustrating associated signals of the electrical machine control system as shown in FIG. 2 in the generator mode.
Figure 5:
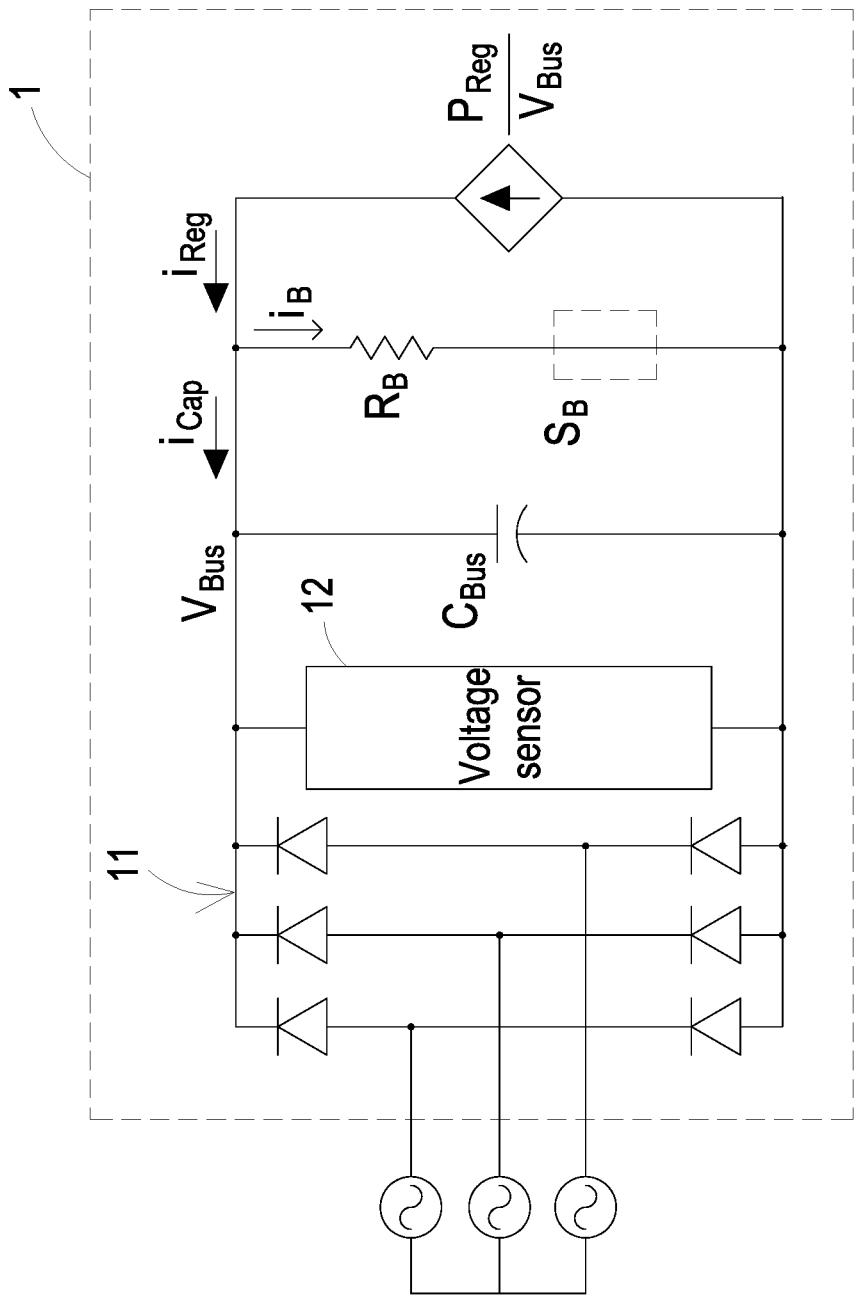
FIG. 5 is a schematic circuit diagram illustrates the electrical machine control system as shown in FIG. 2 when the electrical machine control system is in the generator mode and the switch is in the on state.
Figure 6:
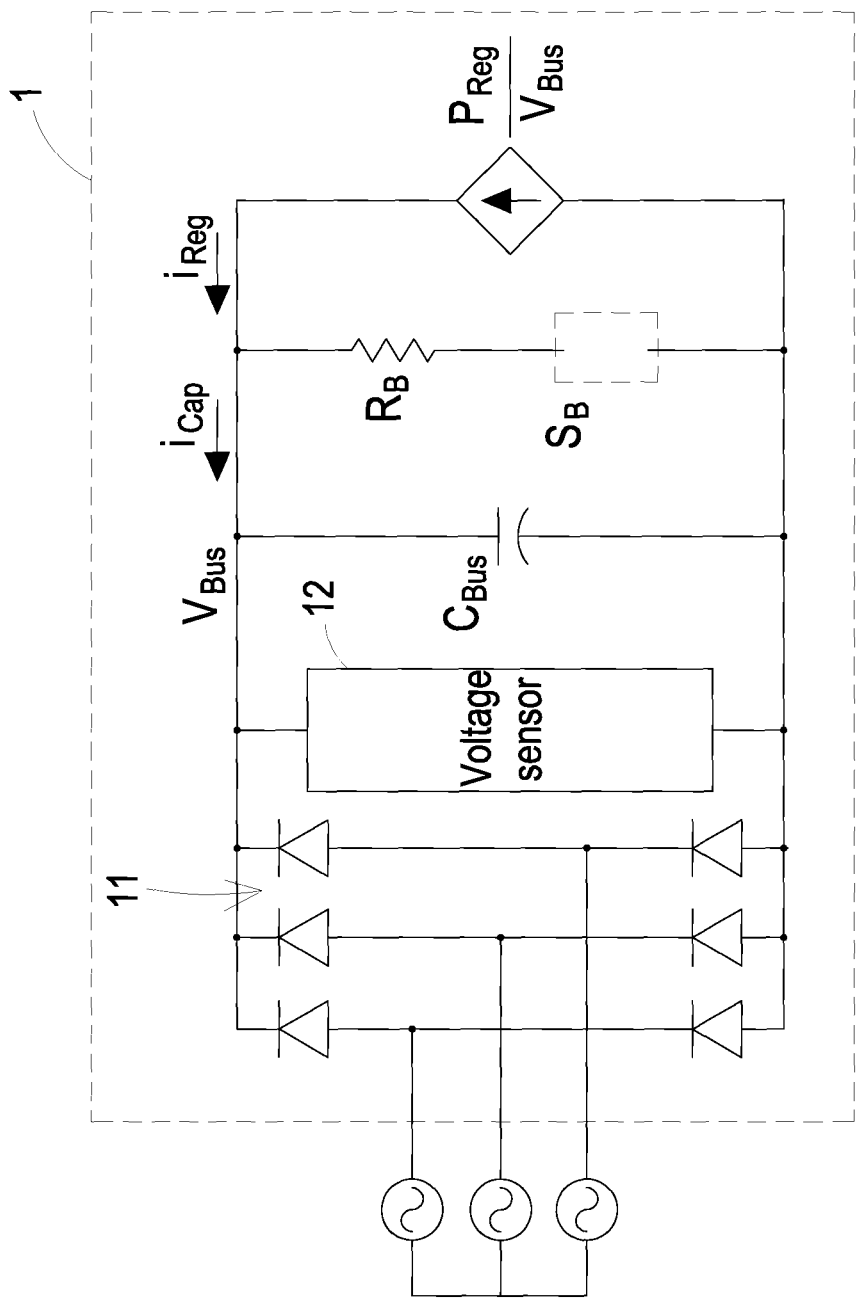
FIG. 6 is a schematic circuit diagram illustrates the electrical machine control system as shown in FIG. 2 when the electrical machine control system is in the generator mode and the switch is in the off state.

Please refer to FIGS. 1A, 1B, 4, 5 and 6. FIG. 4 is a schematic timing waveform diagram illustrating associated signals of the electrical machine control system as shown in FIG. 2 in the generator mode. FIG. 5 is a schematic circuit diagram illustrates the electrical machine control system as shown in FIG. 2 when the electrical machine control system is in the generator mode and the switch is in the on state. FIG. 6 is a schematic circuit diagram illustrates the electrical machine control system as shown in FIG. 2 when the electrical machine control system is in the generator mode and the switch is in the off state. The estimating method comprises the following steps. Firstly, a step S1 is performed to determine whether the electrical machine control system 1 is in a generator mode. If the determination of the step S1 is satisfied, a step S2 is performed. In the step S2, the bus voltage $V_{Bus}$ of the bus capacitor $C_{Bus}$ is monitored by the voltage sensor 12 continuously. Since the bus voltage $V_{Bus}$ of the bus capacitor $C_{Bus}$ is monitored by the voltage sensor 12 continuously, the bus voltage $V_{Bus}$ of the bus capacitor $C_{Bus}$ can be used in the following steps S3 and S6 to confirm whether the switch $S_B$ is in the on state or the off state.

After the step S2, a step S3 is performed to determine whether the switch $S_B$ is turned to the on state. If the determination of the step S3 is satisfied, a step S4 is performed. In the step S4, the current flowing through the bus capacitor $C_{Bus}$ during the off state of the switch $S_B$ is calculated according to a voltage variation of the bus capacitor $C_{Bus}$ from the off state of the switch $S_B$ to the on state of the switch $S_B$, a time duration of the switch $S_B$ in the off state and a known capacitance value of the bus capacitor $C_{Bus}$. The time duration of the switch $S_B$ in the off state indicates the time interval from the off state of the switch $S_B$ to the on state of the switch $S_B$ after the electrical machine control system 1 enters the generator mode. In the step S3, the current flowing through the bus capacitor $C_{Bus}$ may be expressed by the following mathematic formula (1):

$$i_{Cap} = C \frac{dV_{Bus}}{dt} \tag{1}$$

In the above mathematic formula, $i_{Cap}$ is the current flowing through the bus capacitor $C_{Bus}$, C is the known capacitance value of the bus capacitor $C_{Bus}$, and $V_{Bus}$ is the bus voltage of the bus capacitor $C_{Bus}$. After the switch $S_B$ is turned to the on state, the current flowing through the bus capacitor $C_{Bus}$ during the off state of the switch $S_B$ is calculated according to a voltage variation of the bus capacitor $C_{Bus}$ from the off state of the switch $S_B$ to the on state of the switch $S_B$, a time duration of the switch $S_B$ in the off state and the known capacitance value of the bus capacitor $C_{Bus}$. As shown in FIG. 4, the voltage variation of the bus capacitor $C_{Bus}$ from the off state of the switch $S_B$ to the on state of the switch $S_B$ is the difference between the voltage V1 (at time t1) and the voltage V2 (at time t2), and time duration of the switch $S_B$ in the off state is the time interval between the time t1 and the time t2. The value of the current flowing through the bus capacitor $C_{Bus}$ during the off state of the switch $S_B$ may be referred as a first current value. When the switch $S_B$ is in the off state, the recharge current $i_{Reg}$ of the electrical machine 2 recharged to the electrical machine control system 1 is equal to the current $i_{Cap}$ which flowing through the bus capacitor $C_{Bus}$ (i.e., the first current value). Consequently, the recharge current $i_{Reg}$ may be expressed by the following mathematic formula (2):

$$i_{Reg} = i_{Cap} = C \frac{V_2 - V_1}{t_2 - t_1} \tag{2}$$

Moreover, $i_{Reg}$ is also equal to the recharge power $P_{Reg}$ of the electrical machine 2 recharged to the electrical machine control system 1 divided by the bus voltage $V_{Bus}$ of the bus capacitor $C_{Bus}$.

After the step S4, a step S5 is performed. In the step S5, the switch $S_B$ is turned to the on state. For example, at the time t2, the switch $S_B$ is turned to the on state.

Then, a step S6 is performed to determine whether the switch $S_B$ is turned to the off state.

If the determination of the step S6 is satisfied, a step S7 is performed. In the step S7, the current flowing through the bus capacitor $C_{Bus}$ during the on state of the switch $S_B$ is calculated according to a voltage variation of the bus capacitor $C_{Bus}$ from the on state of the switch $S_B$ to the off state of the switch $S_B$, a time duration of the switch $S_B$ in the on state and the known capacitance value of the bus capacitor $C_{Bus}$. The value of the current flowing through the bus capacitor $C_{Bus}$ during the on state of the switch $S_B$ may be referred as a second current value. The time duration of the switch $S_B$ in the on state indicates the time interval from the on state of the switch $S_B$ to the off state of the switch $S_B$ after the electrical machine control system 1 enters the generator mode. Then, a third current value of a current flowing through the braking resistor $R_B$ is estimated according to a difference between the first current value and the second current value. After the voltage variation of the bus capacitor $C_{Bus}$ from the on state of the switch $S_B$ to the off state of the switch $S_B$ is divided by the third current value, a resistance value of the braking resistor $R_B$ is estimated.

That is, if the determination of the step S6 is satisfied, the current flowing through the bus capacitor $C_{Bus}$ during the on state of the switch $S_B$ is calculated according to the voltage variation of the bus capacitor $C_{Bus}$ from the on state of the switch $S_B$ to the off state of the switch $S_B$, the time duration of the switch $S_B$ in the on state and the known capacitance value of the bus capacitor $C_{Bus}$. As shown in FIG. 4, the voltage variation of the bus capacitor $C_{Bus}$ from the on state of the switch $S_B$ to the off state of the switch $S_B$ is the difference between the voltage V2 (at time t2) and the voltage V3 (at time t3), and time duration of the switch $S_B$ in the on state is the time interval between the time t2 and the time t3. The value of the current flowing through the bus capacitor $C_{Bus}$ during the on state of the switch $S_B$ may be referred as a second current value. Consequently, the second current value may be expressed by the following mathematic formula (3):

$$i_{Cap} = C \frac{V_3 - V_2}{t_3 - t_2} \tag{3}$$

When the switch $S_B$ is in the on state, the current is flowing through the braking resistor $R_B$ (also referred as the third current value) is the difference between the recharge current $i_{Reg}$ of the electrical machine 2 recharged to the electrical machine control system 1 and the current value $i_{Cap}$ flowing through the bus capacitor $C_{Bus}$. Consequently, the current is flowing through the braking resistor $R_B$ (i.e., the third current value) may be expressed by the following mathematic formula (4):

$$i_B = i_{Reg} - i_{Cap} \tag{4}$$

Generally, during the transient period of turning the switch $S_B$ from the on state to the off state, the variation of the recharge current $i_{Reg}$ of the electrical machine 2 recharged to the electrical machine control system 1 is not so high. Consequently, the recharge current $i_{Reg}$ of the electrical machine 2 recharged to the electrical machine control system 1 when the switch $S_B$ is in the on state and the recharge current $i_{Reg}$ of the electrical machine 2 recharged to the electrical machine control system 1 when the switch $S_B$ is in the off state are substantially equal. In other words, the recharge current $i_{Reg}$ of the mathematic formula (4) may be introduced into the mathematic formula (2). In the mathematic formula (4), the current $i_{Cap}$ flowing through the bus capacitor $C_{Bus}$ (i.e., the second current value) has been obtained in the mathematic formula (3). Consequently, the current is flowing through the braking resistor $R_B$ (i.e., the third current value) can be estimated. When the switch $S_B$ is in the on state, the current is flowing through the braking resistor $R_B$ (i.e., the third current value) is known, and the bus voltage $V_{Bus}$ of the bus capacitor $C_{Bus}$ is sensed by the voltage sensor 12 continuously. Consequently, the resistance value $R_r$ of the braking resistor $R_B$ can be estimated according to the following mathematic formula (5):

$$R_r = \frac{V_{Bus}}{i_B} \tag{5}$$

If the determination of the step S1 is not satisfied, the step S1 is repeatedly performed. If the determination of the step S3 is not satisfied, the step S3 is repeatedly performed. If the determination of the step S6 is not satisfied, the step S6 is repeatedly performed. After the step S7 is completed, the switch $S_B$ is turned to the off state. If desired, the step S1 could be started again to estimate the resistance value Rr of the braking resistor $R_B$.

In the step S3, if the bus voltage $V_{Bus}$ of the bus capacitor $C_{Bus}$ is increased to reach or above a first threshold voltage value, the electrical machine control system 1 determines that the switch $S_B$ is turned to the on state. In the step S6, if the bus voltage $V_{Bus}$ of the bus capacitor $C_{Bus}$ is decreased to reach or below a second threshold voltage value, the electrical machine control system 1 determines that the switch $S_B$ is turned to the off state. Alternatively, in the step S6, if the time duration of the switch $S_B$ in the on state reaches a threshold time interval, the electrical machine control system 1 determines that the switch $S_B$ is turned to the off state.

From the above descriptions, the present disclosure provides an estimating method for a braking resistor. While the electrical machine control system is in a generator mode, the resistance value of the braking resistor is estimated according to the operating parameters of the electrical machine control system. Consequently, the user can determine whether the resistance value of the braking resistor is proper. If the braking resistor is improper, another proper braking resistor is employed or an associated protection mechanism is enabled. Consequently, the lifespan of the power switch in the discharging loop of the electrical machine control system is prolonged, and the problem of burning out the power switch is avoided.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An estimating method for an electrical machine control system, the electrical machine control system being configured to control operations of an electrical machine, and brake the electrical machine when entering a generator mode, the electrical machine control system comprising a bus capacitor, a braking resistor and a switch, the braking resistor being electrically connected between the bus capacitor and the switch, the estimating method comprising steps of:
   (S1) determining whether the electrical machine control system is in the generator mode;
   (S2) if a determination of the step (S1) is satisfied, monitoring a bus voltage across both terminals of the bus capacitor continuously;
   (S3) determining whether the switch is turned to an on state;
   (S4) if a determination of the step (S3) is satisfied, calculating a first current value of a current flowing through the bus capacitor during an off state of the switch according to a voltage variation of the bus capacitor from the off state of the switch to the on state of the switch, a time duration of the switch in the off state and a known capacitance value of the bus capacitor;
   (S5) turning the switch to the on state;
   (S6) determining whether the switch is turned to the off state; and
   (S7) if a determination of the step (S6) is satisfied, calculating a second current value of a current flowing through the bus capacitor during the on state of the switch according to a voltage variation of the bus capacitor from the on state of the switch to the off state of the switch, a time duration of the switch in the on state and the known capacitance value of the bus capacitor, and estimating a resistance value of the braking resistor according to the first current value and the second current value.

2. The estimating method according to claim 1, wherein the estimating method is executed while the electrical machine is rotated forwardly and the electrical machine control system brakes the electrical machine.

3. The estimating method according to claim 1, wherein the estimating method is executed while the electrical machine is rotated reversely and the electrical machine control system brakes the electrical machine.

4. The estimating method according to claim 1, wherein in the step (S3), if the bus voltage across both terminals of the bus capacitor is increased to a first threshold voltage value, the electrical machine control system determines that the switch is turned to the on state.

5. The estimating method according to claim 1, wherein in the step (S6), if the bus voltage across both terminals of the bus capacitor is decreased to a second threshold voltage value, the electrical machine control system determines that the switch is turned to the off state.

6. The estimating method according to claim 1, wherein in the step (S6), if the time duration of the switch in the on state reaches a threshold time interval, the electrical machine control system determines that the switch is turned to the off state.

7. The estimating method according to claim 1, wherein the electrical machine control system further comprises a frequency converter power module and a rectifier circuit to execute in the generator mode, wherein the frequency converter power module is electrically connected with the bus capacitor, the electrical machine is electrically connected with an output terminal of the frequency converter power module, and the bus capacitor is electrically connected with an output terminal of the rectifier circuit.

8. The estimating method according to claim 7, wherein in the step (S1), when the electrical machine control system is in the generator mode, the rectifier circuit performs unidirectional power conversion, so that the switch is turned between the off state and the on state.

9. The estimating method according to claim 1, wherein the electrical machine control system further comprises a voltage sensor, and the bus voltage across both terminals of the bus capacitor is sensed by the voltage sensor.

10. The estimating method according to claim 1, wherein the step (S7) further comprises steps of:
   estimating a third current value of a current flowing through the braking resistor according to a difference between the first current value and the second current value; and
   estimating the resistance value of the braking resistor according to the voltage variation of the bus capacitor from the on state of the switch to the off state of the switch and the third current value.

* * * * *